United States Patent
Sentoku

[19]

[11] Patent Number: 6,124,922
[45] Date of Patent: Sep. 26, 2000

[54] EXPOSURE DEVICE AND METHOD FOR PRODUCING A MASK FOR USE IN THE DEVICE

[75] Inventor: Koichi Sentoku, Utsunomiya, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/782,382

[22] Filed: Jan. 13, 1997

[30] Foreign Application Priority Data

Jan. 17, 1996 [JP] Japan .................................... 8-023224

[51] Int. Cl.[7] .......................... G03B 27/42; G03B 27/54; G03B 27/32
[52] U.S. Cl. ................................. 355/53; 355/67; 355/77
[58] Field of Search .................................. 355/53, 67, 77, 355/72; 356/400, 401; 250/548

[56] References Cited

U.S. PATENT DOCUMENTS

| | | | |
|---|---|---|---|
| 4,037,969 | 7/1977 | Feldman et al. | 356/172 |
| 5,262,822 | 11/1993 | Kosugi et al. | 355/53 |
| 5,268,744 | 12/1993 | Mori et al. | 356/400 |
| 5,333,050 | 7/1994 | Nose et al. | 356/356 |
| 5,369,486 | 11/1994 | Matsumoto et al. | 356/349 |
| 5,377,009 | 12/1994 | Kitaoka et al. | 356/401 |
| 5,379,108 | 1/1995 | Nose et al. | 356/400 |
| 5,465,148 | 11/1995 | Matsumoto et al. | 356/349 |
| 5,550,635 | 8/1996 | Saitoh et al. | 356/401 |
| 5,585,923 | 12/1996 | Nose et al. | 356/363 |
| 5,654,553 | 8/1997 | Kawakubo et al. | 250/548 |
| 5,674,650 | 10/1997 | Dirksen et al. | 430/22 |

FOREIGN PATENT DOCUMENTS 56-157033  12/1981  Japan .

*Primary Examiner*—Eddie C. Lee
*Assistant Examiner*—Hung Henry Nguyen
*Attorney, Agent, or Firm*—Fitzpatrick, Cella, Harper & Scinto

[57] ABSTRACT

An exposure device in which relative alignment between first and second objects is conducted by using an alignment and in which a pattern on the first object is exposed onto the second object to form the pattern on the first object onto the second object. The exposure device includes a mark detecting device for detecting an actual position of the alignment and for producing a detection signal, a moving device for moving the first and second objects relative to each other to perform alignment of the first and second objects and a control device for storing a positional error of the alignment mark generated when the alignment mark is formed on the second object and for controlling the alignment of the first and second objects by the moving device in accordance with the positional error and the detection signal obtained by the mark detecting device. Also disclosed is a mask producing method, an exposure method and semiconductor device producing methods that include related features.

16 Claims, 9 Drawing Sheets

EXPOSURE DEVICE AND METHOD FOR PRODUCING A MASK FOR USE IN THE DEVICE

BACKGROUND OF THE INVENTION

1. Field of the Invention

The present invention relates to a position detecting apparatus and to a semiconductor device producing method using the position detecting apparatus, which are suitable for use when, for example, relative in-plane alignment between a first object and a second object is conducted in an exposure device for producing semiconductor devices to expose and transfer a minute electronic circuit pattern formed on the surface of the first object, such as a mask or a reticle (hereinafter, referred to as a "mask") onto the surface of the second object, such as a wafer.

2. Description of the Related Art

In conventional exposure apparatus for producing semiconductor devices, relative alignment between the mask and the wafer has been an important factor to improve performance. In particular, in recent exposure apparatus, there is a demand for relative alignment of high accuracy, which is on the order, for example, of submicron or less to provide more highly integrated semiconductor devices.

The distance between the mask and the wafer is measured by an inter-plane distance measuring device or the like. After the distance has been measured and control has been effected so as to attain a predetermined distance value, alignment between the mask and the wafer is effected by utilizing positional information obtained from so-called alignment patterns provided on the mask and the wafer surfaces. Various methods are available for this alignment. For example, the amount of deviation between the alignment patterns is detected by performing image processing. Alternatively, as proposed in U.S. Pat. No. 4,037,969 and Japanese Unexamined Patent Publication No. 56-157033, a zone plate is used for an alignment pattern; a beam is applied to this zone plate, and the position of a convergent point in a predetermined plane of a beam outgoing from this zone plate is detected.

Generally speaking, when compared with methods that simply use an alignment mark, the method using a zone plate is more advantageous in that an alignment of relatively high accuracy is possible without being affected by any defect in the alignment mark.

Figure 12:
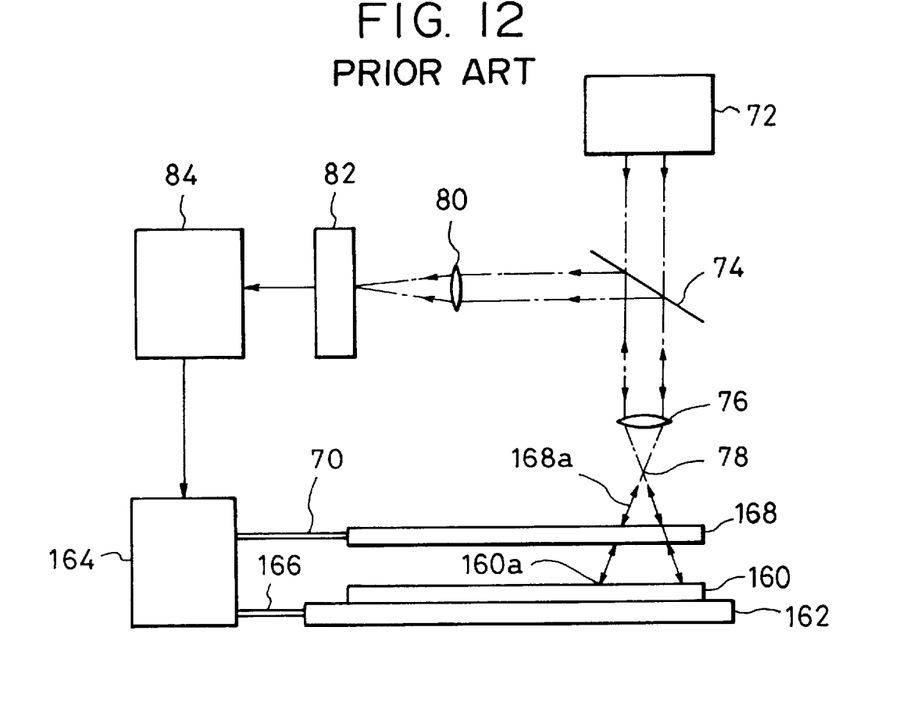
FIG. 12 is a schematic diagram showing the essential portion of a conventional position detecting device.

FIG. 12 is a schematic diagram showing a conventional position detecting device using zone plates.

In FIG. 12, a parallel beam emitted from a light source 72 is transmitted through a half mirror 74, and then condensed at a converging point 78 by a condensing lens 76. After this, the beam is applied to a mask alignment pattern 168a on a mask 168 and a wafer alignment pattern 160a on a wafer 160, placed on a support base 162. These alignment patterns 168a and 160a are formed by reflection-type zone plates, each forming a converging point in a plane orthogonal to the optical axis that includes the converging point 78. Any deviation in the converging point 78 in the orthogonal plane at this time is transmitted to a detector 82 by the condensing lens 76, half mirror 74 and a lens 80 and is thereby detected.

Then, in accordance with an output signal from the detector 82, a driving circuit 164 is driven by a control circuit 84 to effect relative alignment between the mask 168 and the wafer 160.

Figure 13:
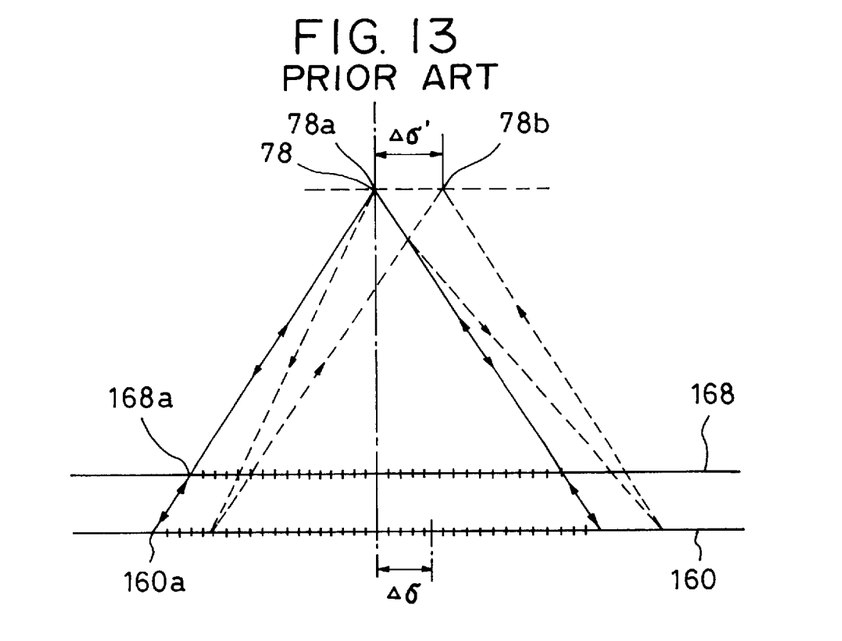
FIG. 13 is a diagram illustrating a portion of FIG. 12.

FIG. 13 is a diagram illustrating the image formation relationship between the beams from the mask alignment pattern 168a and the wafer alignment pattern 160a shown in FIG. 12.

In FIG. 13, part of the beam diverging from the converging point 78 is diffracted by the mask alignment pattern 168a to form, in the vicinity of the converging point 78, a converging point 78a indicating the mask position. The remaining part of the beam is transmitted through the mask 168 as zero-order transmitted light and impinges upon the wafer alignment pattern 160a on the wafer 160 without change in the wavefront. At this time, the beam is diffracted by the wafer alignment pattern 160a, and then transmitted through the mask 168 again as zero-order transmitted light before it is condensed in the vicinity of the converging point 78 to form a converging point 78b indicating the wafer position. In FIG. 13, when the beam diffracted by the wafer 160 forms a converging point, the mask 168 is simply transmissible.

The position of the converging point 78b due to the wafer alignment pattern 160a thus formed is formed as a deviation amount $\Delta\sigma'$ corresponding to a deviation amount $\Delta\sigma$ along the plane that is orthogonal to the optical axis that includes the converging point 78, in accordance with the deviation amount $\Delta\sigma$ of the wafer 160 with respect to the mask 168 in the direction along the surfaces of the mask/wafer (lateral direction).

It is generally known that when a pattern on a mask is exposed on a wafer to produce a semiconductor device, the mask pattern formed on the wafer is shifted due to exposure distortion. In view of this, when performing relative alignment between the mask and the wafer, various measures are taken, taking this shift amount into consideration, beforehand.

In the position detecting method using a conventional exposure device for producing semiconductor devices, in which relative alignment between first and second objects is conducted using an alignment mark previously exposed on the second object (wafer) and an alignment mark on the first object (mask), exposure distortion is generated due to the limits of the exposure light source, so that exposure is sometimes effected with the exposure position of the alignment mark exposed on the second object being shifted from a step exposure position. Thus, the alignment mark on the first object is aligned with respect to the alignment mark, which has shifted from the predetermined exposure position, on the second object, with the result that the relative alignment cannot be conducted correctly.

Further, even when the exposure distortion is taken into account and each point in the shot is arranged on the first object, with the corresponding shift amount being set in each pattern (including the alignment mark), alignment cannot be conducted correctly when relative alignment is effected by using the alignment mark on the first object and the alignment mark on the second object, which is affected by exposure distortion.

SUMMARY OF THE INVENTION

It is an object of the present invention to provide a position detecting device which, when performing relative alignment between first and second objects, corrects alignment error between the objects due to exposure distortion to thereby make it possible to effect highly accurate relative alignment, and a semiconductor device producing method using such a position detecting device.

To achieve the above object, there is provided, in one aspect of the present invention, an exposure device of the type in which relative alignment between first and second objects is conducted by using an alignment mark and in which a pattern on the first object is exposed onto the second object to form the pattern on the first object onto the second object, the exposure device comprising:

mark detecting means for detecting an actual position of the alignment mark and for producing a detection signal;

moving means for moving the first and second objects relative to each other to perform alignment of the first and second objects; and control means for storing a positional error of the alignment mark generated when the alignment mark is formed on the second object and for controlling the alignment of the first and second objects by the moving means in accordance with the positional error and the detection signal obtained by the mark detecting means.

In a preferred form, the alignment mark is formed by exposing an alignment mark pattern on a third object onto the second object by using the exposure device.

In a preferred form, the control means, after the moving means performs alignment between the first and second objects in accordance with the detection signal, the alignment error of the first and second objects due to the above-mentioned positional error, by the moving means.

In a preferred form, the control means corrects the detection signal by using the positional error, and effects the alignment of the first and second objects by the moving means in accordance with the corrected detection signal.

In a preferred form, the positional error is obtained from information regarding the exposure condition when the alignment mark is formed on the second object.

The information regarding the exposure condition can include the distance between the first and second objects when the alignment mark is formed.

In another aspect of the present invention, there is provided a mask producing method of the type in which relative alignment between a mask and a wafer is effected by using an alignment mark and in which a pattern on the mask is exposed onto the wafer to form the pattern on the mask onto the wafer, the method comprising the steps of:

obtaining a positional error of the alignment mark when the alignment mark is formed on the wafer; and forming the alignment mark on the mask at a position obtained by correcting the positional error.

In a preferred form, the alignment mark is formed by exposing an alignment mark pattern on another mask, different from the above-mentioned mask, onto the second object, and the method further includes obtaining the positional error on the basis of information regarding the exposure conditions at the time of the exposure.

In still another aspect of the present invention, there is provided an exposure method of the type in which relative alignment between first and second objects is conducted by using an alignment mark and in which a pattern on the first object is exposed onto the second object to form the pattern on the first object onto the second object, the method comprising the steps of:

a mark detecting step for detecting the position of the alignment mark;

storing a positional error of the alignment mark when the alignment mark is formed on the second object; and performing alignment between the first and second objects in accordance with the positional error and the result obtained in the mark detecting step.

In a preferred form, the alignment mark is formed by exposing an alignment mark on a third object onto the second object.

The alignment step can include correcting, after performing alignment between the first and second objects in accordance with the result of the mark detecting step, the alignment error of the first and second objects due to the positional error.

The alignment step can include correcting the result of the mark detecting step by using the positional error, and further including performing alignment between the first and second objects in accordance with the corrected result.

Further, there is provided a step for obtaining the positional error from information regarding the exposure conditions when the alignment mark is formed on the second object.

A preferable example of information regarding the exposure conditions includes the distance between the first and second objects when the alignment mark is formed.

In a further aspect of the present invention, there is provided an exposure method of the type in which relative alignment between a mask and a wafer is effected by using an alignment mark and in which a pattern on the mask is exposed onto the wafer to form the pattern on the mask onto the wafer, the method comprising the steps of:

obtaining a positional error of the alignment mark when the alignment mark is formed on the wafer;

forming the alignment mark on the mask at a position obtained by correcting the positional error;

a mark detecting step for detecting the position of the alignment mark; and performing alignment between the mask and the wafer on the basis of the result of the mark detecting step.

The alignment mark can be formed by exposing an alignment mark pattern onto another mask, different from the above-mentioned mask, onto the wafer, and further including a step for obtaining the positional error on the basis of information regarding the exposure conditions at the time of the exposure.

In a still further aspect of the present invention, there is provided a semiconductor device producing method of the type in which alignment between a mask and a wafer is effected by using an alignment mark and in which a pattern on the mask is exposed onto the wafer to form the pattern on the mask onto the wafer before submitting the wafer to a developing process, the semiconductor device producing method comprising the steps of:

a mark detecting step for detecting the position of the alignment mark;

storing the positional error of the alignment mark when the alignment mark is formed on the wafer; and performing alignment between the mask and the wafer in accordance with the positional error and the result of the mark detecting step.

In a still further aspect of the present invention, there is provided a semiconductor device producing method of the type in which relative alignment between a mask and a wafer is effected by using an alignment mark and in which a pattern on the mask is exposed onto the wafer to form the pattern on the mask onto the wafer before the wafer is subjected to a developing process to produce a semiconductor device, the semiconductor device producing method comprising the steps of:

obtaining the positional error of the alignment mark when the alignment mark is formed on the wafer;

forming the alignment mark on the mask at the position obtained by correcting the positional error;

a mark detecting step for detecting the position of the alignment mark; and performing alignment between the mask and the wafer in accordance with the result of the mark detecting step.

Specific embodiments of the present invention will be described below.

DESCRIPTION OF THE PREFERRED EMBODIMENTS

Figure 1:
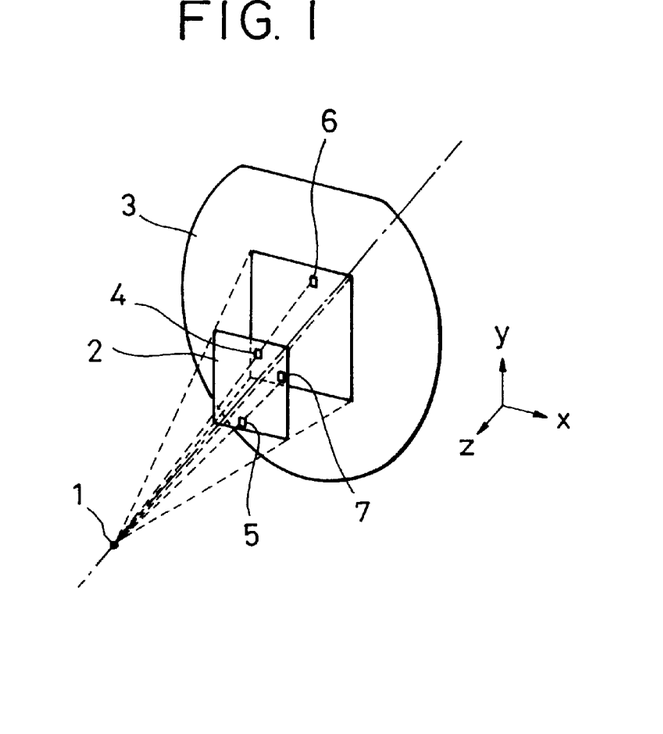
FIG. 1 is a diagram illustrating the position detecting principle of the position detecting device of the present invention.
Figure 2:
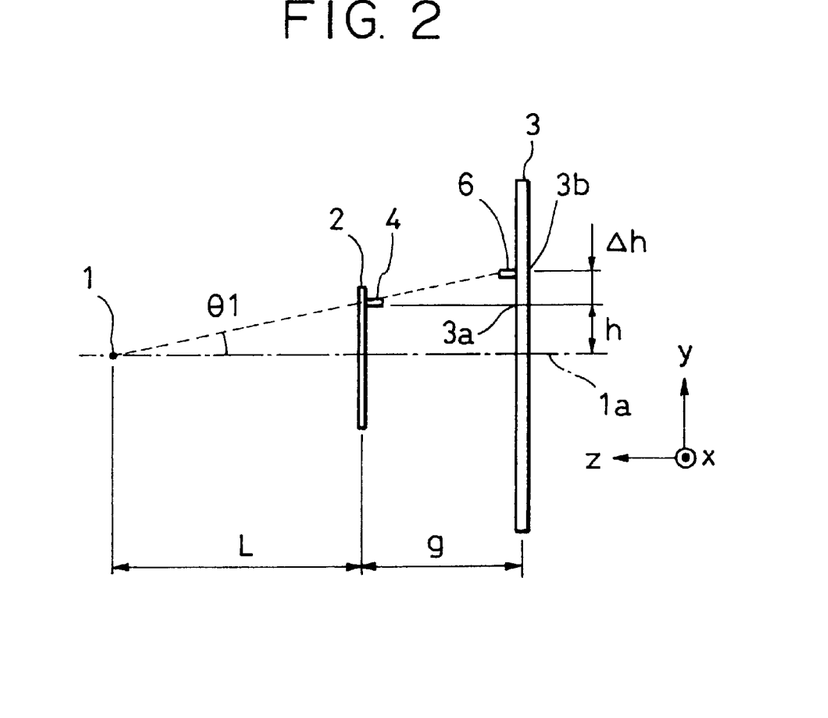
FIG. 2 is a side view of FIG. 1.
Figure 3A:
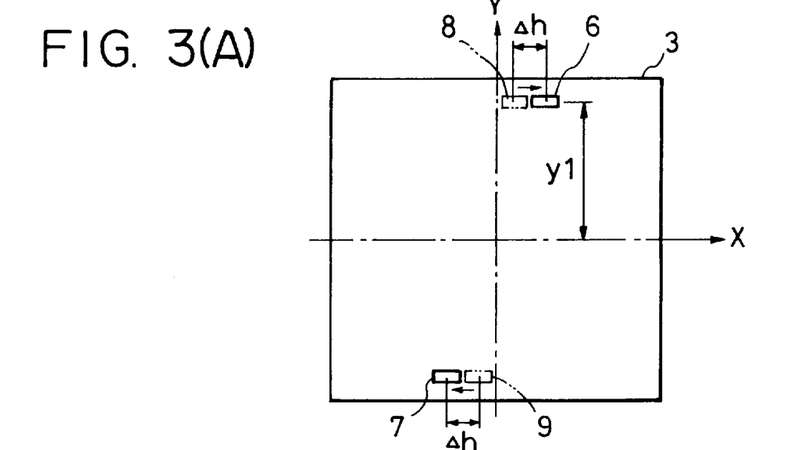
FIGS. 3(A) through 3(C) are diagrams illustrating the alignment process of FIG. 1.
Figure 3B:
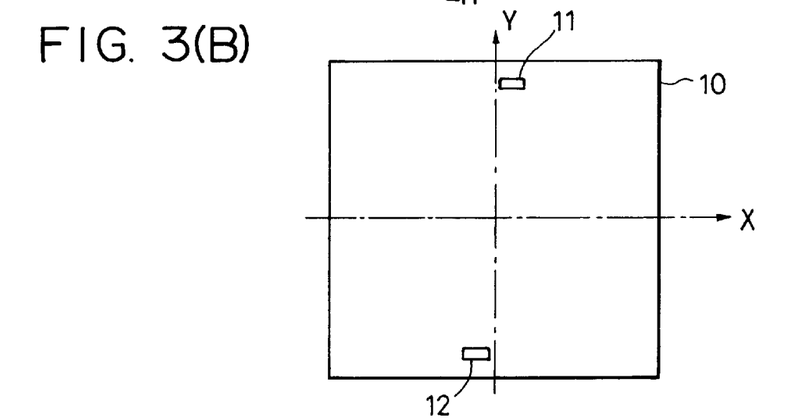
Figure 3C:
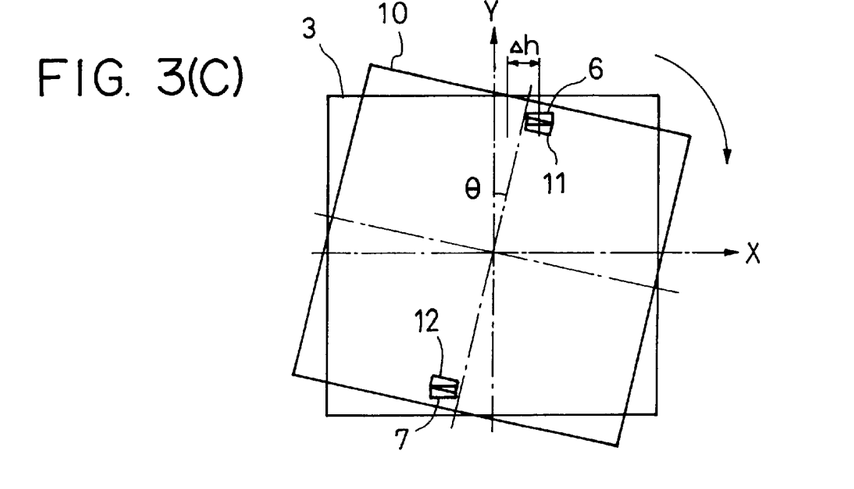

FIGS. 1 and 2 are diagrams illustrating the position detecting principle of the position detecting device of the present invention and FIGS. 3(A) through 3(C) are diagrams illustrating the alignment process of the present invention.

FIG. 1 is a perspective view showing an exposure light source 1, a mask (first object) 2 and a wafer (second object) 3 as well as the relative positional relationship between a plurality of alignment marks provided on the mask 2 and the wafer 3. In FIG. 1, an exposure beam emitted from the exposure light source 1 is applied to an irradiation area of the mask 2 to expose alignment marks 4 and 5 and an integrated circuit (IC) pattern (not shown) on the mask 2 onto the wafer 3.

FIG. 2 is a schematic side view of FIG. 1. Next, an alignment error, which is a deviation amount due to exposure distortion, will be explained with reference to FIG. 2.

In FIG. 2, since the exposure light source (light emitting surface) 1 has a limited size, the exposure position on the wafer 3 of the alignment mark 4 of the mask 2 is not position 3a, which is directly under the alignment mark 4, but is position 3b, which is deviated from position 3a by an amount proportional to the distance between the optical axis of the exposure light and the alignment mark 4.

In FIG. 2, assuming that symbol L indicates the distance between the exposure light source 1 and the mask 2, symbol g indicates the distance between the mask 2 and the wafer 3 and symbol h indicates the distance in the y-direction between the optical axis 1a of the exposure beam and the alignment mark 4, the deviation amount $\Delta h$ due to exposure distortion of the transfer position on the wafer 3 of the alignment mark 4 is given by the following equation:

$$\Delta h = (g/L) \times h \tag{1}$$

Thus, as shown in FIG. 3(A), when the alignment marks 4 and 5 of the mask 2 for the n-th layer exposure ought to be exposed on the wafer 3 as alignment marks 8 and 9 on the wafer 3, indicated by the dotted lines, alignment marks 6 and 7, respectively, are actually formed at positions which are shifted in the x-direction by $\Delta h$ due to exposure distortion.

When a mask 10 for the (n+1)th layer exposure, as shown in FIG. 3(B) is aligned with respect to the wafer 3 shown in FIG. 3(A) by using the position detecting device shown in FIG. 1, alignment is effected such that the mask 10 is rotated by an angle θ, as shown in FIG. 3(C). Assuming that the length of the normal extending from the center of the alignment mark 6 on the wafer 3 to the center line in the x-direction is y1, the alignment of the mask 10 is effected such that it is rotated by $\theta = \Delta h / y1$ with respect to the wafer 3.

In this embodiment, information regarding the exposure condition when the alignment mark of the mask for the n-th layer exposure is exposed on the wafer is stored beforehand. Here, the information regarding the exposure condition consists of the distance L between the exposure light source 1 and the mask 2 and the distance between the mask 2 and the wafer 3 at the time of exposure. The distance g between the mask 2 and the wafer 3 is measured by the position detection device of the present invention at the time of exposure. Then, from the exposure condition stored and the distance of the alignment mark from the optical axis of the exposure beam, the shift amount of the alignment mark on the wafer 3 due to exposure distortion is obtained, or stored after being obtained, and, after relative alignment between the wafer 3 and the mask 10 for the (n+1)th layer exposure is effected by correction means, the mask 10 is reversely rotated by the rotation amount θ obtained or stored, whereby the alignment error due to exposure distortion is compensated for.

Figure 4:
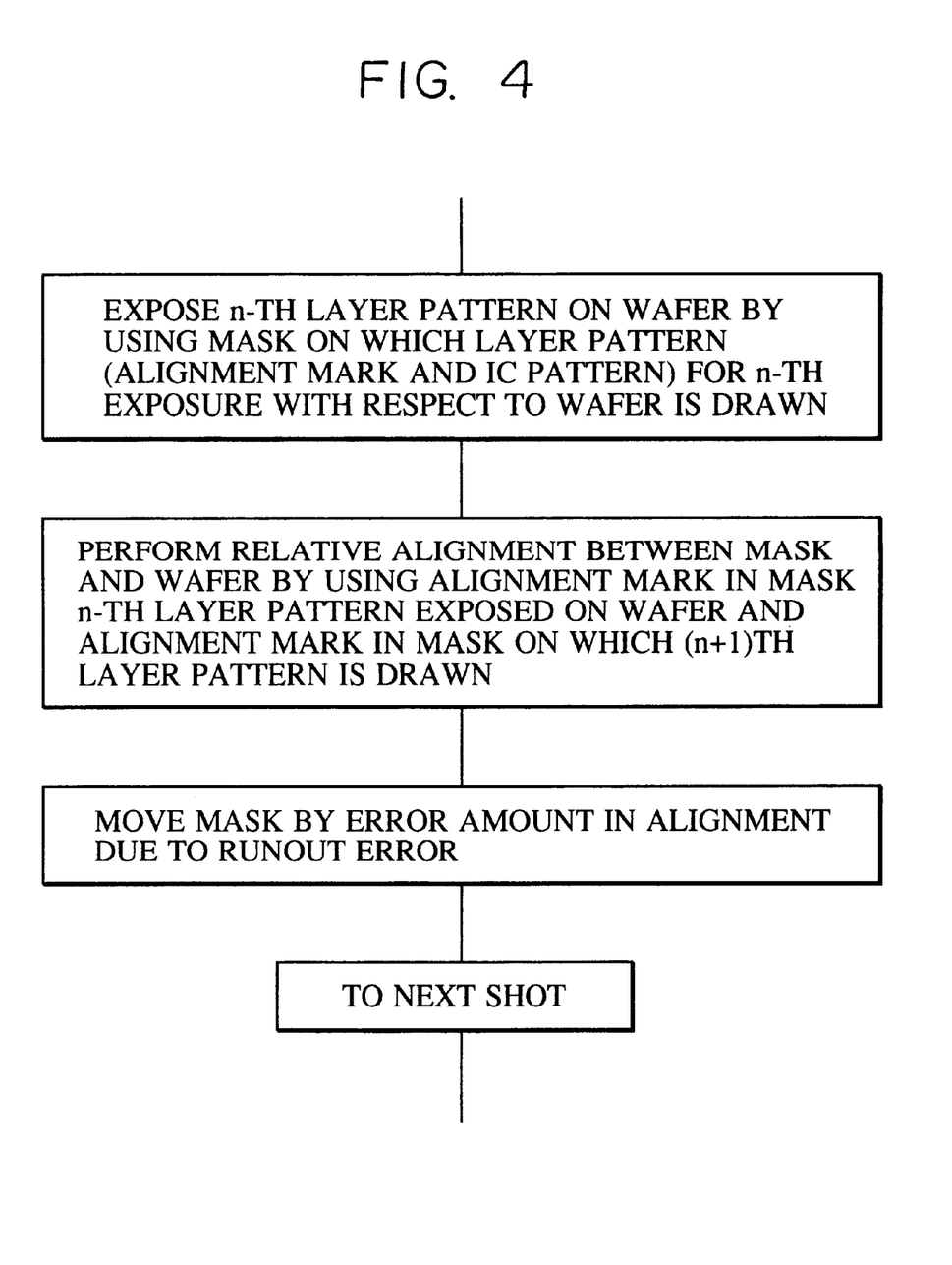
FIG. 4 is a flowchart illustrating the alignment process of FIG. 1.

FIG. 4 is a flowchart showing the sequence discussed above for the alignment error correction.

Figure 7:
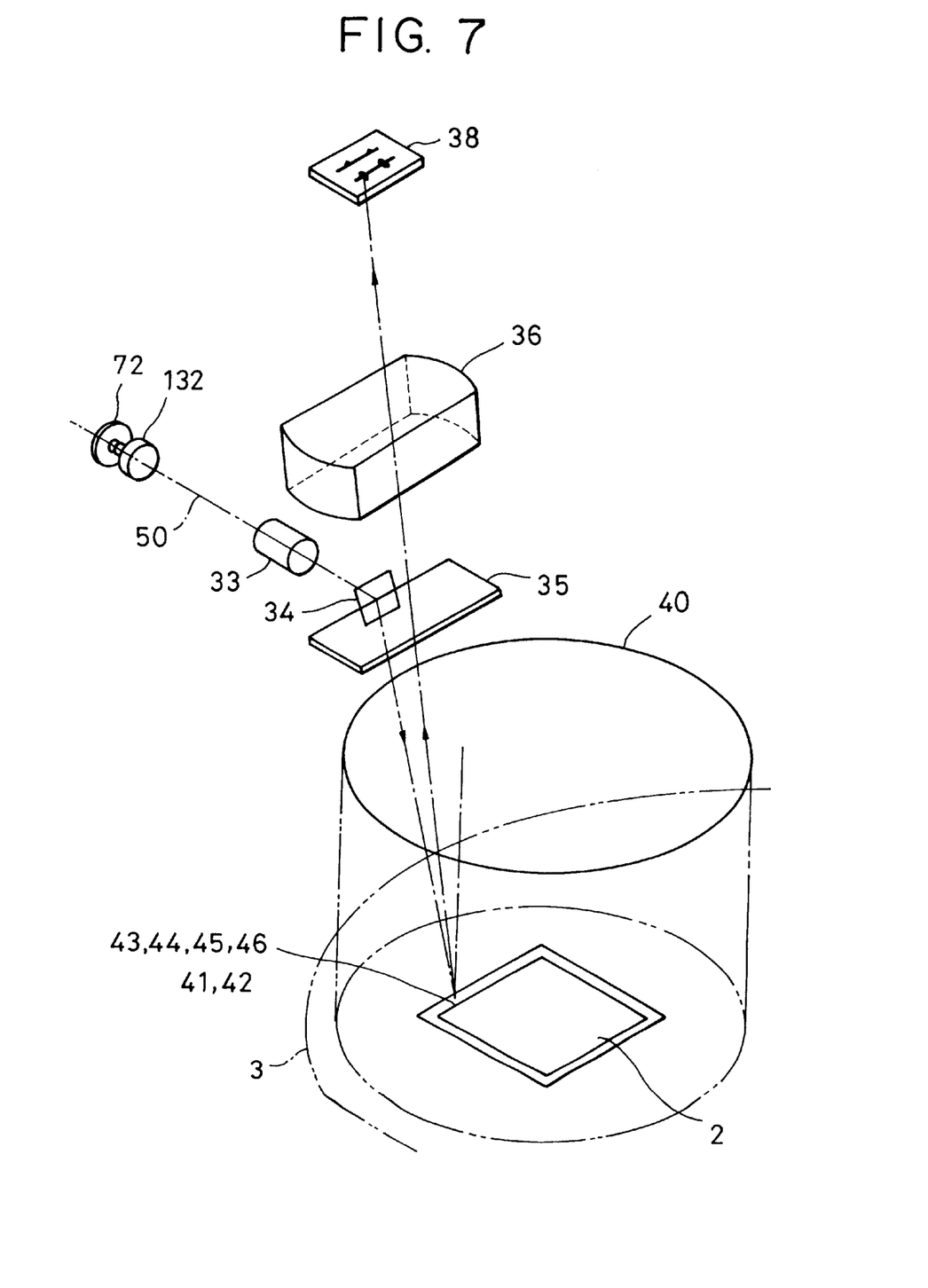
FIG. 7 is a schematic diagram showing the essential portion of the position detecting device of the present invention.
Figure 8:
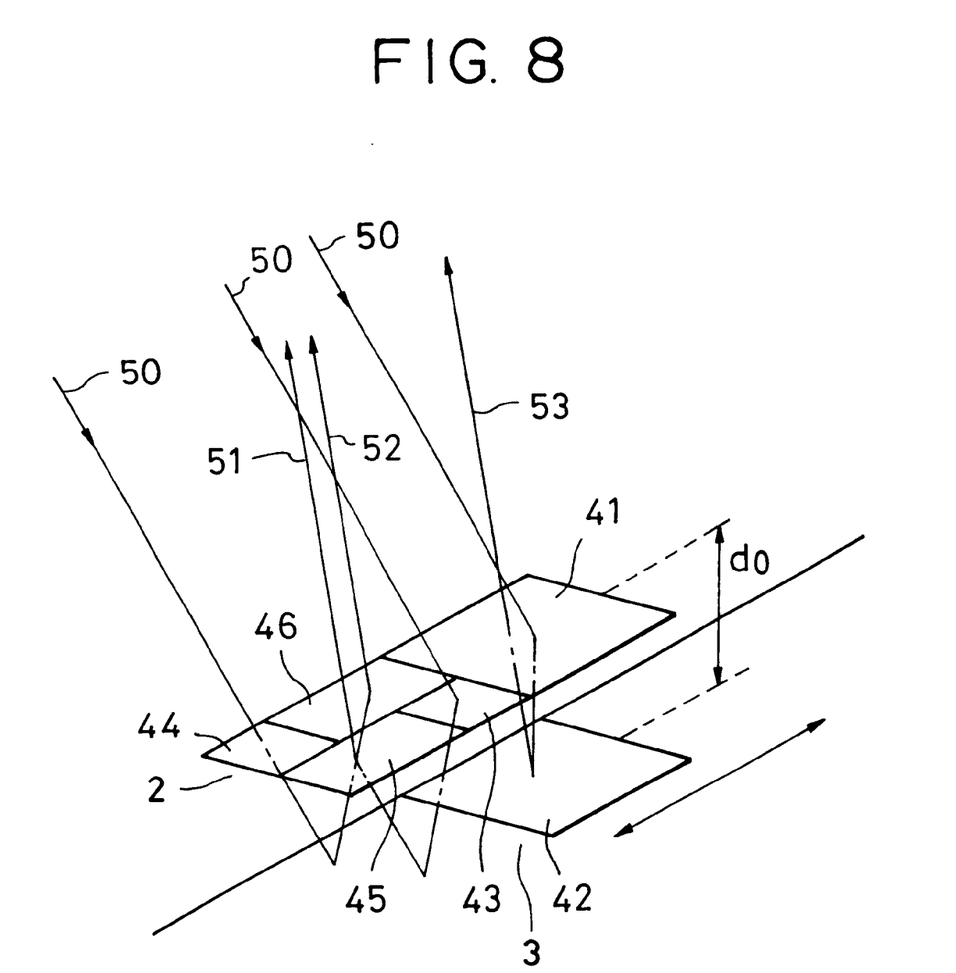
FIG. 8 is an enlarged view showing a portion of FIG. 7.

FIG. 7 is a schematic diagram showing the essential portion of the position detecting device of the present invention as applied to a proximity type exposure device for semiconductor device production. FIG. 8 is an enlarged view illustrating a portion of FIG. 7.

In these drawings, reference numeral 2 indicates a mask constituting the first object, on the surface of which an electronic circuit pattern and an alignment mark 41 are formed. Reference numeral 3 indicates a wafer constituting the second object, on the surface of which an alignment mark 42 is formed. Reference numerals 43, 44, 45 and 46 indicate alignment marks consisting of physical optical elements provided on the mask 2. The physical optical elements 43, 44, 45 and 46 are alignment marks (AF marks) for detecting the distance between the mask 2 and the wafer 3. The physical optical elements 41 and 42 are alignment marks (AA marks) for the in-plane direction detection of the mask 2 and the wafer 3, i.e., alignment marks for detecting so-called lateral deviation.

The physical optical elements of this embodiment consist of grating lenses with a one-dimensional or a two-dimensional lens function, Fresnel zone plates, diffraction gratings with no lens function or the like.

Reference numeral 72 indicates a laser beam source, which emits a coherent beam 50 with satisfactory directivity. Reference numeral 132 indicates a collimator lens. Reference numeral 33 indicates a projection lens, which projects a laser beam 50 from laser beam source 72 onto the alignment marks 41, 43, 44, 45 and 46 on the mask 2 through a mirror 34 and a filter 35. Reference numeral 38 indicates a detecting section, which consists, for example, of a line sensor such as a CCD. Reference numeral 36 indicates a light receiving lens, which condenses beams 51 and 52, including distance information from the mask 2, and a beam 53, including in-plane misalignment information, and guides the beams to the detecting section 38.

In FIG. 8, the beam 51 (52) is a beam obtained by diffracting the beam 50 by the first physical-optical elements 43 and 44 on the mask 2, reflecting it at the wafer 3, and diffracting it by the second physical-optical elements 45 and 46 on the mask 2. The beam 53 is a beam obtained by subjecting the beam 50 to optical action by the physical-optical element 41 on the mask 2 and the physical-optical element 42 on the mask 3. A method based on image processing, an optical heterodyne method or the like is applicable to the misalignment detection method of this embodiment.

While in the case shown in FIGS. 3(A) through 3(C), the alignment in the x-direction is effected by using two alignment marks 6 and 7 arranged symmetrically with respect to the central point of the wafer 3, when two alignment marks are arranged symmetrically with respect to the center line in the x-direction or when alignment is performed by using a single alignment mark, any error in alignment due to exposure distortion appears as a parallel shift in the x-direction of the mask 3. In that case, parallel movement of the mask 10 is effected in the direction opposite to the shifting direction of the alignment mark by the amount of parallel shift of the alignment mark due to exposure distortion after the alignment of the wafer 3 and the mask 10.

While in this embodiment the correction of the alignment error due to exposure distortion is effected through rotation or parallel shift of the mask 10, it is also possible to effect the correction by moving the wafer 3 instead of the mask 10. Further, while this embodiment has been described with reference to a case in which alignment is effected in the x-direction, it is also possible to correct the alignment error due to exposure distortion in a similar manner in the case of the alignment in the y-direction.

Next, a second embodiment of the present invention will be described.

While in the first embodiment the alignment error due to exposure distortion is corrected by moving the mask or the wafer, in the second embodiment, the correction is effected by previously imparting the shift amount of the alignment mark due to the influence of exposure distortion to the alignment value of mask and the wafer as an offset. Suppose, as shown in FIG. 3(A), exposure of the alignment mark on the wafer 3 is effected, with the alignment mark being shifted by $\Delta h$ from the position where it ought to be formed due to the influence of exposure distortion. Here, $-\Delta h$ is imparted beforehand as an offset to the alignment value obtained as a result of the relative alignment of the wafer 3 and the mask 10, whereby the alignment error due to the influence of exposure distortion is corrected to thereby effect proper alignment.

Thus, this embodiment is characterized in that, in the processes of effecting relative alignment between first and second objects and exposing the pattern on the first object onto the second object to form the pattern on the first object onto the second object, an offset value, in which the shift amount of the alignment mark formation position on the second object is taken into account, is given beforehand in order that no relative alignment error may be generated between the first and second objects by the shifting of the alignment mark formation position for the alignment on the second object due to the influence of exposure distortion.

Next, a third embodiment of the present invention will be described with reference to FIGS. 5(A), 5(B) and 6.

Figure 5A:
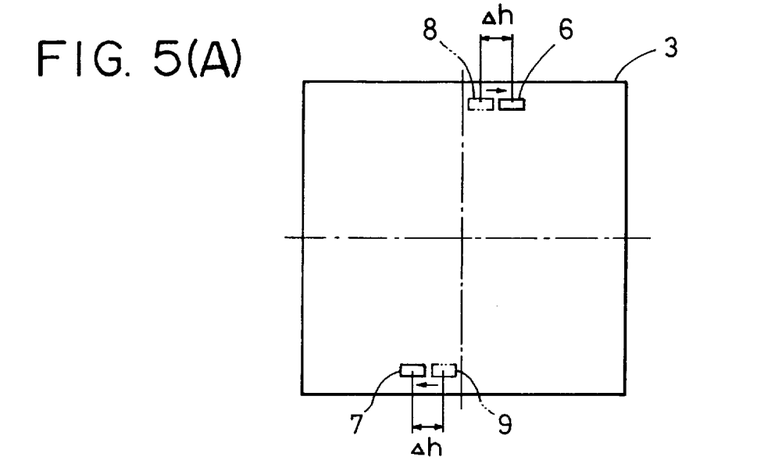
FIGS. 5(A) and 5(B) are diagrams illustrating the alignment process of FIG. 1.
Figure 5B:
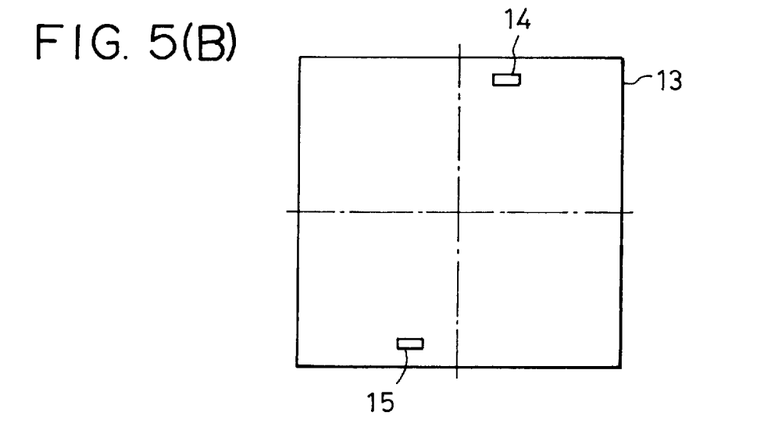
Figure 6:
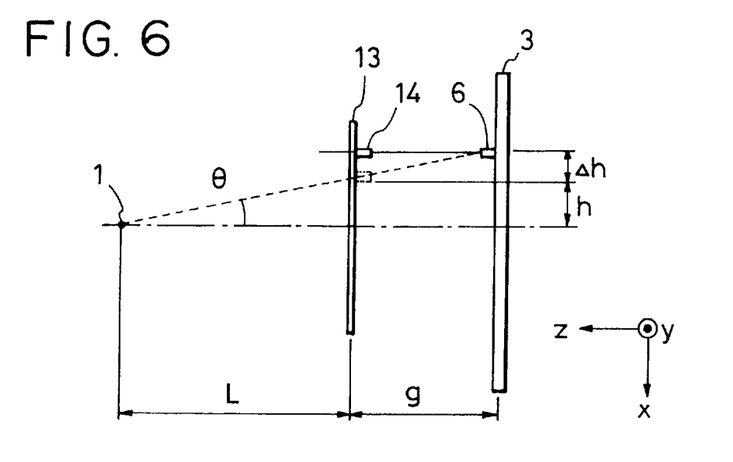
FIG. 6 is a side view of another embodiment of the position detecting device of the present invention.

As shown in FIG. 5(A), the alignment marks 4 and 5 (see FIG. 1) of the mask 2 for the n-th layer exposure ought to be exposed at the positions indicated by the dotted lines as alignment marks 8 and 9 on the wafer. However, due to the influence of exposure distortion, alignment marks 6 and 7 are formed at positions shifted in the x-direction by $\Delta h$. In view of this, in this embodiment, as shown in FIG. 6, there are arranged, in correspondence with the alignment marks 6 and 7 on the wafer 3, alignment marks 14 and 15, which are drawn on the mask taking the shift amount $\Delta h$ of the alignment marks 6 and 7 on the wafer 3 into consideration. Using a mask 13 for the (n+1)th layer (FIG. 5(B)), the alignment of the mask 13 and the wafer 3 is effected. FIG. 6 shows how relative alignment is effected between the mask 13 and the wafer 3.

Figure 9:
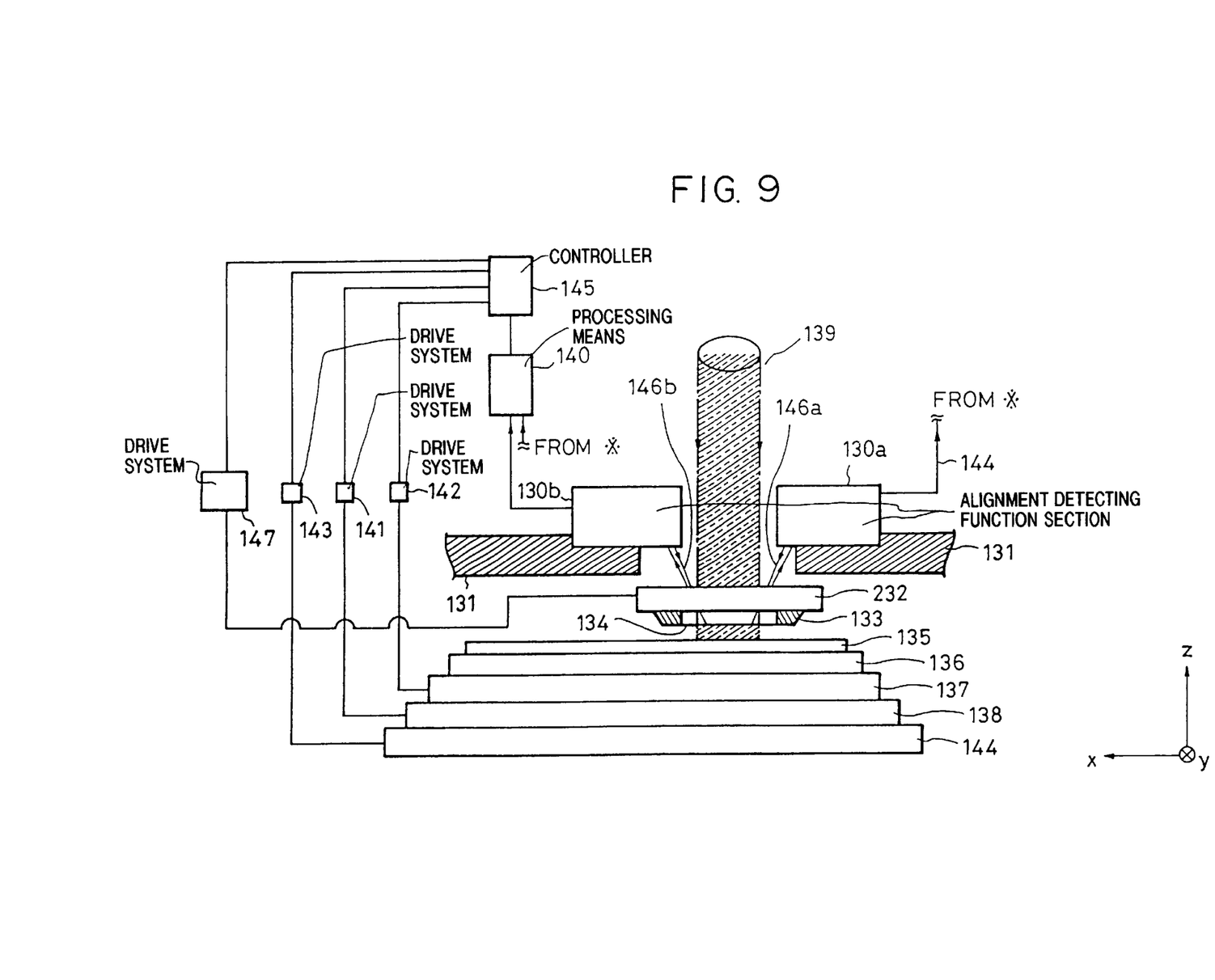
FIG. 9 is a schematic diagram showing the essential portion of the position detecting device of the present invention as applied to an exposure device for semiconductor device production.

FIG. 9 is a schematic diagram showing the essential portion of the position detecting device of the present invention as applied to an exposure device for semiconductor device production utilizing X-rays.

In FIG. 9, reference numeral 139 indicates an X-ray beam, which is substantially a parallel beam, which is applied to the surface of a mask 134. Reference numeral 135 indicates a wafer whose surface is coated, for example, with a resist for X-rays. Reference numeral 133 indicates a mask frame, and reference numeral 134 indicates a mask membrane (mask), on the surface of which the patterning of a circuit pattern is effected by an X-ray absorber. Reference numeral 232 indicates a mask support member; reference numeral 136 indicates a wafer fixing member such as a wafer chuck; and reference numeral 137 indicates a z-axis stage, which is actually constructed so as to allow tilting. Reference numeral 138 indicates an x-axis stage, and reference numeral 144 indicates a y-axis stage.

The mask/wafer alignment detecting function sections (the position detecting device) described with reference to the above embodiments are accommodated in casings 130a and 130b, from which information regarding the gap between the mask 134 and the wafer 135 and on the misalignment in the x- and y-in-plane directions is obtained.

Further, the alignment detecting function sections also measure the exposure condition when the alignment mark is exposed on the wafer, i.e., the gap.

While FIG. 9 only shows two alignment detecting function sections 130a and 130b, two more alignment detecting function sections are provided in correspondence with the other sides of the square IC circuit pattern area on the mask 134. Optical systems and detection systems are also accommodated in the casings 130a and 130b. Reference numerals 146a and 146b indicate alignment beams from the alignment systems.

Signals obtained by these alignment detecting function sections are processed by processing means 140 to obtain misalignment information in the x-y plane and the gap value. The results thus obtained are judged and, when they are not within predetermined values, the driving systems 142, 141 and 143 of the axis stages are moved by controller 145 so as to obtain a value within a predetermined mask/wafer misalignment, and the mask 134 or the wafer 135 is moved through the driving system 147 of the mask support member by an amount that corrects the alignment error due to exposure distortion. After this, an X-ray exposure beam 139 is applied to the mask 134. Until the alignment is completed, an X-ray shielding member (not shown) is maintained shut. In FIG. 9, the X-ray source, the X-ray illumination system, etc., are omitted. Further, the processing means stores the exposure condition when the alignment mark is formed on the wafer, and obtains and stores the exposure distortion therefrom.

While the example shown in FIG. 9 is an X-ray exposure device of a proximity type, the present invention also applies to an optical stepper. Further, in the present invention, an i-beam (365 nm), a KrF-excimer beam (248 nm), an ArF-excimer beam (193 nm) or the like may be used as the light source, and the invention is applicable to a reduction projecting exposure device of a sequential movement type having an illumination beam from such a light source or a one-to-one mirror projection type exposure device.

Next, an embodiment of the semiconductor device producing method using the above-described projection exposure device will be described.

Figure 10:
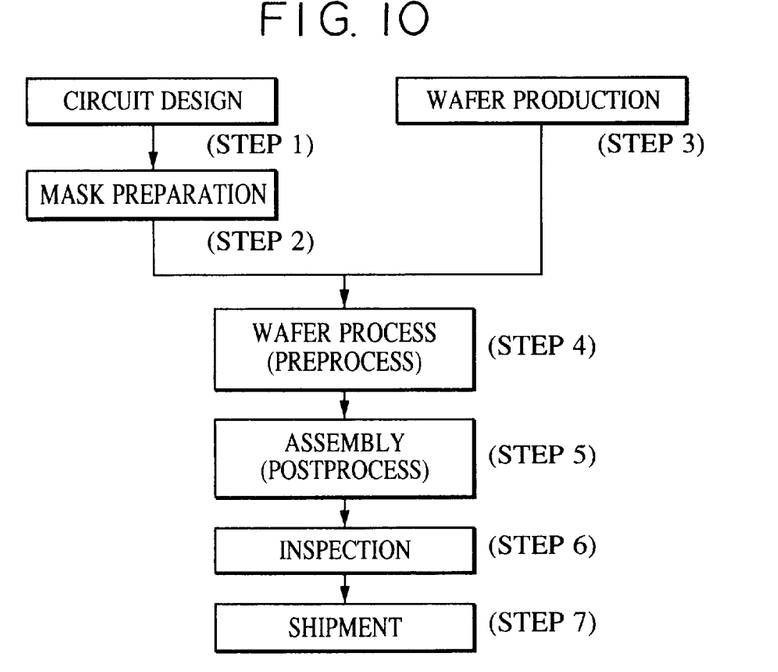
FIG. 10 is a flowchart of semiconductor device production according to the present invention.

FIG. 10 is a flowchart of the production of a semiconductor device (a semiconductor chip, such as, an IC or an LSI, a liquid crystal panel, a CCD, etc.).

In step 1 (circuit design), the circuit design of a semiconductor device is conducted. In step 2 (mask production), a mask on which the designed circuit pattern is formed is produced.

In step 3 (wafer production), a wafer is produced by using a material such as silicon. In step 4 (wafer process), which is called a preprocess, the actual circuit is formed on the wafer by lithography by using the mask and the wafer previously prepared.

Next, in step 5 (assembly), which is called a postprocess, semiconductor chips are obtained by using the wafer prepared in step 4, this step including an assembly step (dicing, bonding), a packaging step (chip sealing), etc.

In step 6 (inspection), inspection processes, such as the checking of the operation of the semiconductor devices prepared in step 5, a durability test, etc., are conducted. Through these processes, the semiconductor devices are completed and shipped (step 7).

Figure 11:
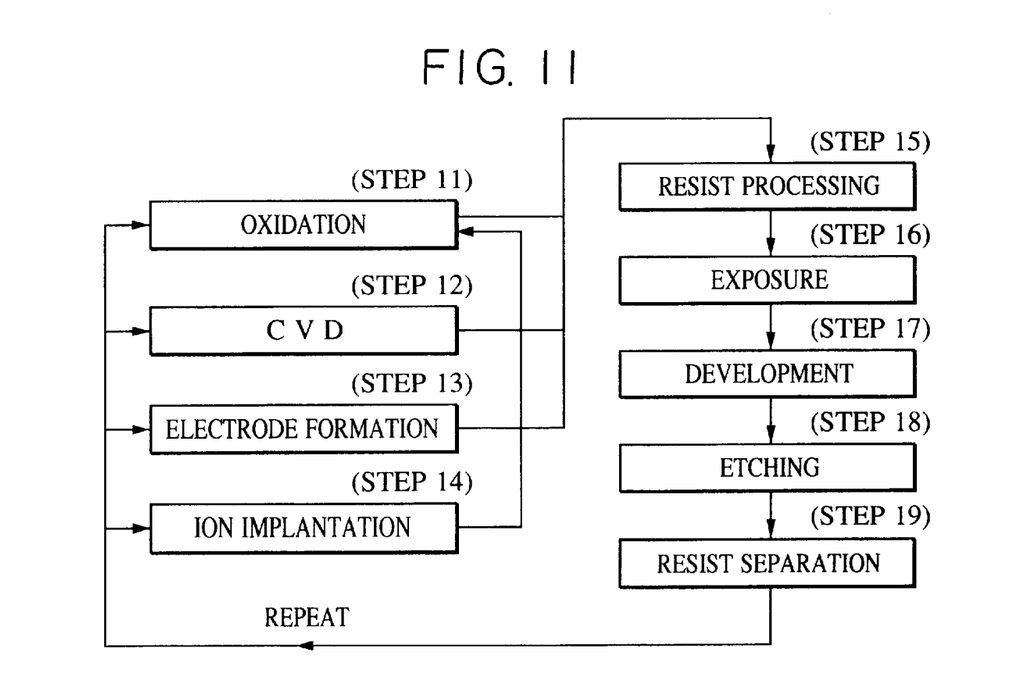
FIG. 11 is a flowchart of semiconductor device production according to the present invention.

FIG. 11 is a detailed flowchart of the above-mentioned wafer process (step 3). First, in step 11 (oxidation), the wafer surface is oxidized. In step 12 (CVD), an insulating layer is formed on the wafer surface.

In step 13 (electrode formation), electrodes are formed on the wafer by evaporation. In step 14 (ion implantation), ions are implanted in the wafer. In step 15 (resist processing), a photosensitive material is applied to the wafer. In step 16 (exposure), the circuit pattern of the mask is exposed on the wafer by the above-described exposure device.

In step 17 (development), the exposed wafer is developed. In step 18 (etching), the portion other than the developed resist is cut off. In step 19 (resist separation), the resist which has become unnecessary after etching is removed. By repeating these processes, a multiplex circuit pattern is formed on the wafer.

By using the production method of this embodiment, it is possible to easily produce a high-integration semiconductor device which has conventionally been difficult to produce.

Except otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A mask producing method in which relative alignment between a mask and a wafer is effected by using an alignment mark and in which a pattern on the mask is exposed onto the wafer to form the pattern on the mask onto the wafer, said method comprising the steps of:

obtaining exposure distortion alignment error data when the pattern on the mask is exposed onto the wafer, wherein the exposure distortion alignment error data is obtained on a basis of information regarding exposure conditions at the time of the pattern exposure; and thereafter, forming the alignment mark onto the mask at a position obtained by correcting a positional error on the basis of the obtained exposure distortion alignment error data.

2. An exposure method in which relative alignment between a mask and a wafer is effected by using an alignment mark and in which a pattern on the mask is exposed onto the wafer to form the pattern on the mask onto the wafer, said method comprising the steps of:

obtaining exposure distortion alignment error data when the pattern on the mask is exposed onto the wafer, wherein the exposure distortion alignment error data is obtained on a basis of information regarding exposure conditions at the time of the exposure;

thereafter, forming the alignment mark onto the mask at a position obtained by correcting a positional error on the basis of the obtained exposure distortion alignment error data;

a mark detecting step for detecting an actual position of the alignment mark; and performing alignment between the mask and the wafer on the basis of a result of said mark detecting step.

3. An exposure apparatus, including an exposure light source having an optical axis, in which relative alignment of a first object and a second object is conducted by using a plurality of alignment mark patterns formed on the first object and a plurality of alignment marks formed on the second object, in which a mask pattern on the first object is exposed to project the mask pattern onto the second object, and which corrects an alignment error between the first and second objects due to an exposure distortion, said exposure apparatus comprising:

alignment mark detecting means for detecting an actual position of at least one of the plurality of alignment marks formed on the second object and for producing a detection signal;

position detecting means for (i) detecting positional information when the plurality of alignment marks are formed on the second object, the positional information including information relating to a distance between the exposure light source and the first object, a distance between the first and second objects, and the distance between at least one of the plurality of alignment mark patterns and the optical axis of the exposure light, and (ii) producing positional error data including exposure distortion alignment error data based on the detected positional information, the exposure distortion alignment error data representing an amount proportional to the distance between the optical axis of the exposure light and at least one of the plurality of alignment marks formed on the second object;

moving means for moving the first and second objects relative to each other to perform alignment of the first and second objects; and control means for storing the positional information and the detection signal, and for controlling the alignment of the first and second objects by said moving means in accordance with both the positional error data and the detection signal obtained by said alignment mark detecting means, said control means compensating for the exposure distortion when aligning the first and second objects using the exposure distortion alignment error data.

4. An apparatus according to claim 3, wherein the plurality of alignment marks are formed by projecting a plurality of alignment mark patterns on a third object onto the second object by using said exposure apparatus, and the positional information includes information relating to a distance between the exposure light source and the third object, a distance between the third and second objects, and the distance between at least one of the plurality of alignment mark patterns and the optical axis of the exposure light.

5. An apparatus according to claim 3, wherein said control means controls said moving means to align the first and second objects in accordance with the detection signal, and then controls said moving means to correct the alignment error of the first and second objects in accordance with the positional information including the exposure distortion alignment error data.

6. An apparatus according to claim 3, wherein the exposure distortion alignment error data includes a value obtained when the plurality of alignment marks are formed on the second object by mathematically dividing the distance between the first and second objects by the distance between the exposure light source and the first object and mathematically multiplying by the distance between at least one of the plurality of alignment mark patterns and the optical axis of the exposure light.

7. An apparatus according to claim 3, wherein said control means corrects the detection signal obtained by said alignment mark detecting means by using the positional information, including the exposure distortion alignment error data, to produce a correct ed detection signal, and controls said moving means to effect the alignment of the first and second objects in accordance with the corrected detection signal.

8. An exposure method using an exposure apparatus having an exposure light source with an optical axis, in which relative alignment of a first object and a second object is conducted by using a plurality of alignment mark patterns formed on the first object and a plurality of alignment marks formed on the second object, in which a mask pattern on the first object is exposed to project the mask pattern onto the second object, and which corrects an alignment error between the first and second objects due to an exposure distortion, said exposure method comprising the steps of:

detecting an actual position of at least one of the plurality of alignment marks formed on the second object and producing a detection signal;

detecting positional information when the plurality of alignment marks are formed on the second object, the positional information including information relating to a distance between the exposure light source and the first object, a distance between the first and second objects, and the distance between at least one of the plurality of alignment mark patterns and the optical axis of the exposure light;

producing positional error data including exposure distortion alignment error data based on the detected positional information, the exposure distortion alignment error data representing an amount proportional to the distance between the optical axis of the exposure light and at least one of the plurality of alignment marks formed on the second object;

moving the first and second objects relative to each other to perform alignment of the first and second objects using moving means;

storing the positional information and the detection signal; and controlling the alignment of the first and second objects by the moving means in accordance with both the positional error data and the detection signal, using the exposure distortion alignment error data to compensate for the exposure distortion when aligning the first and second objects.

9. A method according to claim 8, further comprising forming the plurality of alignment marks by projecting a plurality of alignment mark patterns on a third object onto the second object by using the exposure apparatus, wherein the positional information includes information relating to a distance between the exposure light source and the third object, a distance between the third and second objects, and the distance between at least one of the plurality of alignment mark patterns and the optical axis of the exposure light.

10. A method according to claim 8, wherein said controlling step comprises controlling the moving means to align the first and second objects in accordance with the detection signal, and then controlling the moving means to correct the alignment error of the first and second objects in accordance with the positional information including the exposure distortion alignment error data.

11. A method according to claim 8, wherein the detected exposure distortion alignment error data includes a value obtained when the plurality of alignment marks are formed on the second object by mathematically dividing the distance between the first and second objects by the distance between the exposure light source and the first object and mathematically multiplying by the distance between at least one of the plurality of alignment mark patterns and the optical axis of the exposure light.

12. A method according to claim 8, wherein said controlling step corrects the detection signal using the positional information, including the exposure distortion alignment error data, to produce a corrected detection signal, and controls the moving means to effect the alignment of the first and second objects in accordance with the corrected detection signal.

13. A semiconductor device producing method using an exposure apparatus having an exposure light source with an optical axis, in which relative alignment of a mask and a wafer is conducted by using a plurality of alignment mark patterns formed on the mask and a plurality of alignment marks formed on the wafer, in which a mask pattern on the mask is exposed to project the mask pattern onto the wafer before submitting the wafer to a developing process, and which corrects an alignment error between the mask and wafer due to an exposure distortion, said exposure method comprising the steps of:

detecting an actual position of at least one of the plurality of alignment marks formed on the wafer and then producing a detection signal;

detecting positional information when the plurality of alignment marks are formed on the wafer, the positional information including information relating to a distance between the exposure light source and the mask, a distance between the mask and wafer, and the distance between at least one of the plurality of alignment mark patterns and the optical axis of the exposure light, and producing positional error data including exposure distortion alignment error data based on the detected positional information, the exposure distortion alignment error data representing an amount proportional to the distance between the optical axis of the exposure light and at least one of the plurality of alignment marks formed on the wafer;

moving the mask and wafer relative to each other to perform an alignment of the mask and wafer using moving means;

storing the positional information and the detection signal; and controlling the alignment of the mask and wafer by said moving means in accordance with both the positional error data and the detection signal, using the exposure distortion alignment error data to compensate for the exposure distortion when aligning the mask and wafer.

14. A method according to claim 13, wherein said controlling step corrects the detection signal using the positional information, including the exposure distortion alignment error data, to produce a corrected detection signal, and controls the moving means to effect the alignment of the first and second objects in accordance with the corrected detection signal.

15. An exposure apparatus, including an exposure light source having an optical axis, in which relative alignment of a first object and a second object is conducted by using a plurality of alignment mark patterns formed on the first object and a plurality of alignment marks formed on the second object, in which a mask pattern on the first object is exposed to project the mask pattern onto the second object, and which corrects an alignment error between the first and second objects due to an exposure distortion, said exposure apparatus comprising:

alignment mark detecting means for detecting an actual position of at least one of the plurality of alignment marks formed on the second object and for producing a detection signal;

position detecting means for (i) detecting positional information when the plurality of alignment marks are formed on the second object, the positional information including information relating to a distance between the exposure light source and the first object, a distance between the first and second objects, and the distance between at least one of the plurality of alignment mark patterns and the optical axis of the exposure light, and (ii) producing positional error data including exposure distortion alignment error data based on the detected positional information, the exposure distortion alignment error data representing an amount proportional to the distance between the optical axis of the exposure light and at least one of the plurality of alignment marks formed on the second object, and includes a value obtained when the plurality of alignment marks are formed on the second object by mathematically dividing the distance between the first and second objects by the distance between the exposure light source and the first object and mathematically multiplying by the distance between at least one of the plurality of alignment mark patterns and the optical axis of the exposure light;

moving means for moving the first and second objects relative to each other to perform an alignment of the first and second objects; and control means for storing the positional information and the detection signal, and for controlling said moving means to align the first and second objects in accordance with both the positional error data and the detection signal obtained by said alignment mark detecting means.

16. An apparatus according to claim 15, wherein said control means controls said moving means to first align the first and second objects in accordance with the detection signal, and thereafter corrects the alignment error of the first and second objects in accordance with the positional information including the exposure distortion alignment error data using said moving means.

* * * * *

UNITED STATES PATENT AND TRADEMARK OFFICE
CERTIFICATE OF CORRECTION

PATENT NO.   : 6,124,922
DATED        : September 26, 2000
INVENTOR(S)  : Koichi Sentoku It is certified that error appears in the above-identified patent and that said Letters Patent is hereby corrected as shown below:

Column 7:
Line 51, "mask" should read -- the mask --.

Signed and Sealed this

Eleventh Day of September, 2001

Attest:

Nicholas P. Godici

NICHOLAS P. GODICI
Attesting Officer   Acting Director of the United States Patent and Trademark Office